United States Patent [19]
Yasumoto et al.

[11] Patent Number: 5,412,160
[45] Date of Patent: May 2, 1995

[54] CIRCUIT BOARD

[75] Inventors: Takaaki Yasumoto, Kawasaki; Nobuo Iwase, Kamakura; Kaoru Koiwa, Kawasaki; Koji Yamakawa, Kawasaki; Kiyoshi Iyogi, Kawasaki, all of Japan

[73] Assignee: Kabushiki Kaisha Toshiba, Kawasaki, Japan

[21] Appl. No.: 212,869

[22] Filed: Mar. 15, 1994

[30] Foreign Application Priority Data

Mar. 15, 1993 [JP] Japan .................................. 5-054350

[51] Int. Cl.$^6$ .............................................. H05K 1/00
[52] U.S. Cl. .................................... 174/258; 174/262; 174/266; 361/750
[58] Field of Search ............... 174/250, 258, 262, 263, 174/264, 265, 266, 268; 361/750, 748

[56] References Cited

U.S. PATENT DOCUMENTS 4,880,567 11/1989 Prabhu et al.
5,225,286 7/1993 Fujikawa et al.
5,258,047 11/1993 Tokisue et al.

OTHER PUBLICATIONS

IEICE, JPm. Technical Report, CPM91-75, Keiichiro Kata, et al., "Ultra-Low Dielectric Constant Multilayer Ceramic Substrate", pp. 7-12, 1991.

Am. Ceram. Soc., vol. 26, A. Das, et al., "A Morphological Study of Low-Dielectric-Permittivity Substrates for Packaging VLSIs", pp. 419-430, 1989.

Proc,. 39th Electric Components Conference, U. Mohideen, et al., "Ultra-Low Dielectric Permittivity Ceramics and Composites For High speed IC Packaging Applications", pp. 406-412, 1987.

*Primary Examiner*—Leo P. Picard
*Assistant Examiner*—Cheryl R. Figlin
*Attorney, Agent, or Firm*—Oblon, Spivak, McClelland, Maier & Neustadt

[57] ABSTRACT

A circuit board comprising a substrate, at least one dielectric film formed on the substrate and made of at least one selected from the group consisting of AlN, BN, diamond, diamond-like carbon, BeO and SiC, the dielectric film having pores of a porosity of 5 to 95% by volume, and at least one wiring metal film formed on the dielectric film.

7 Claims, 3 Drawing Sheets

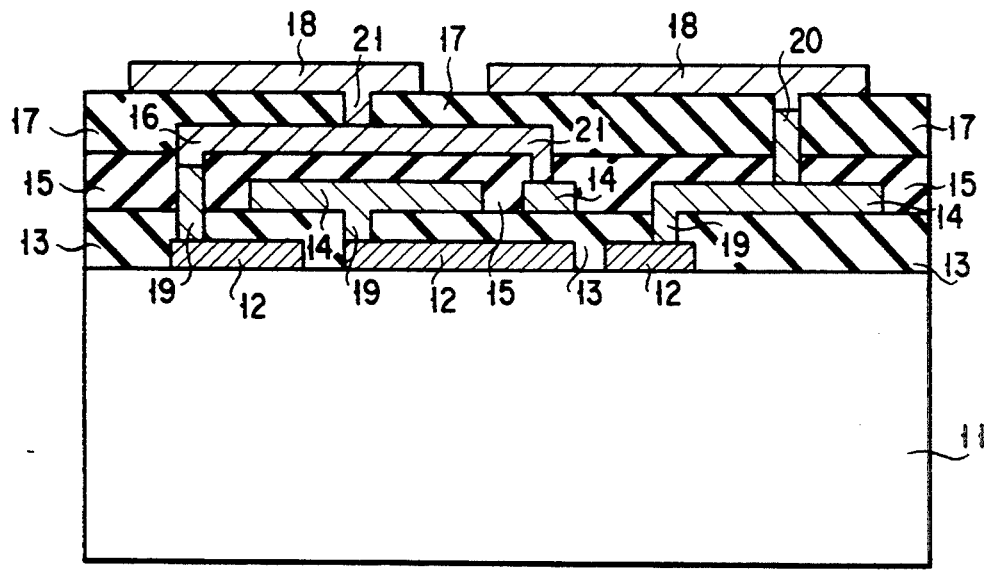
F I G. 3
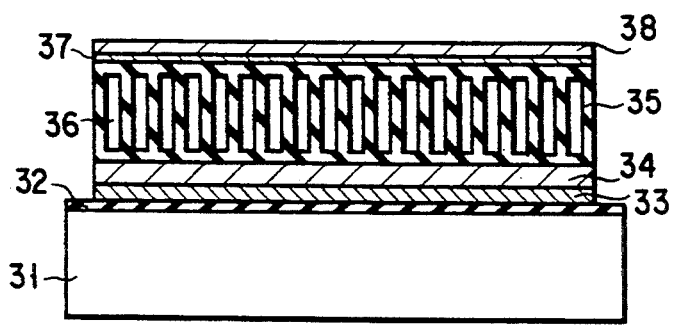
F I G. 4
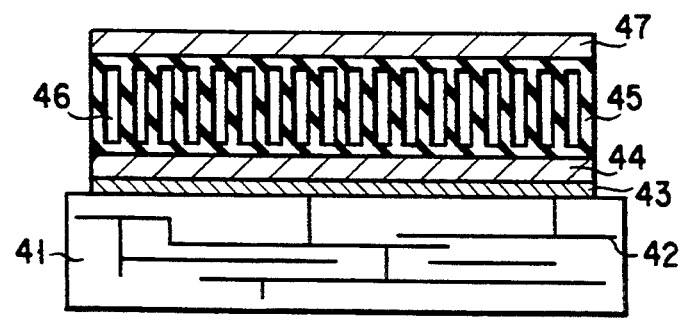
F I G. 5

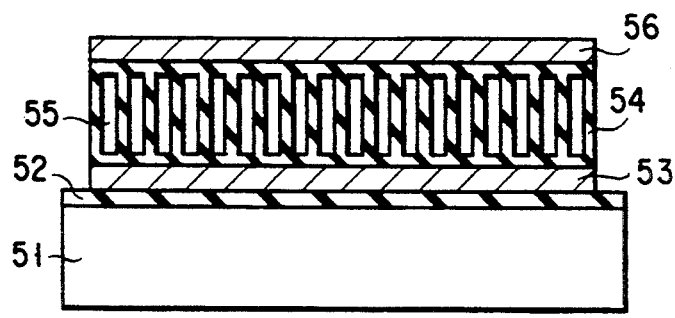
F I G. 6
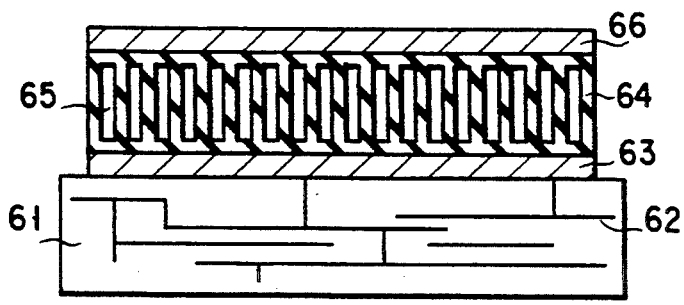
F I G. 7
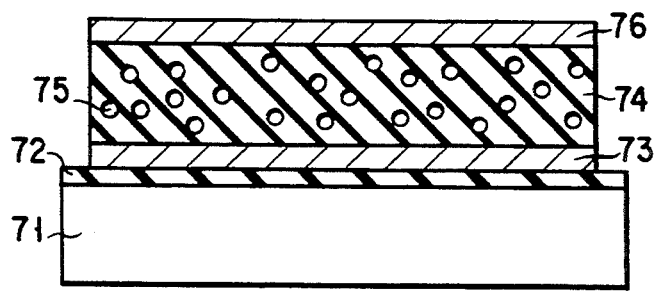
F I G. 8
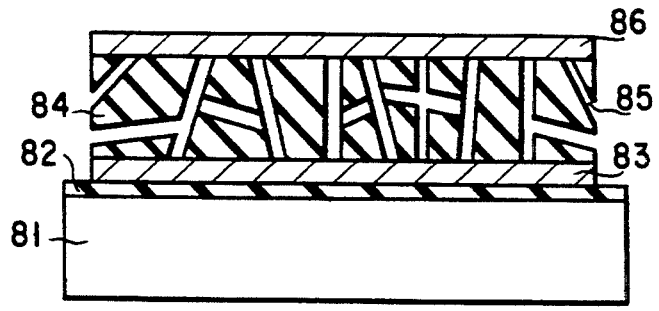
F I G. 9

CIRCUIT BOARD

BACKGROUND OF THE INVENTION

1. Field of the Invention

The present invention relates to a circuit board on which electronic devices such as semiconductor integrated circuit devices are to be mounted to constitute a computer system or the like.

2. Description of the Related Art

In accordance with an increase in demand for a miniaturized computer system which can operate at a high speed, the operation speed and the integration density of a semiconductor device to be mounted in the system has been increasing in an accelerated manner. Recently, a semiconductor device which has a clock frequency of 100 MHz and consumes a power of 30 W or more per chip, has been brought into practice. A circuit board on which such a semiconductor device is to be mounted must have a high heat-radiating property and a high speed signal-transmitting property, so that the superior characteristics of the device can reflect on the characteristics of the computer system. To improve a heat-radiating property, a high thermal conductivity is required, and to increase a signal transmitting speed, a low dielectric constant is required.

Concerning the heat-radiating property of the above two properties required for a circuit board, high thermal conductivity materials having a high thermal conductivity coefficient of about 30 to 3000 $W \cdot m^{-1} \cdot K^{-1}$), such as AlN, BN, diamond, diamond-like carbon, BeO and SiC, are suitable for improving this property. However, the dielectric constant of the high thermal conductivity materials is higher, by 2.5 to 15 times, than that of low dielectric constant material described below. Thus, in the case of using the high thermal conductivity material, the signal transmitting speed is inevitably low. those of low dielectric constant materials.

On the other hand, concerning the signal transmitting speed, desirable materials for circuit board are the above-mentioned low dielectric constant materials, such as $SiO_2$, polyimide, Teflon, which have low dielectric constants of about 3 to 3.8. Those materials are suitable for a circuit board, in order to increase the signal transmission speed. Further, a demand for lower dielectric constant materials has increased in accordance with the increase in signal transmission speed and the increase in size of the circuit board. Several materials having a dielectric constant of less than 3, which satisfy the demand, are known; however, none of them has satisfactory characteristics as a practical dielectric film, e.g., the resistivity, the moisture resistance, and the heat radiating property. In particular, the thermal conductivity of the low dielectric constant material is considerably low, as low as 1/3000 to 1/30 that of the high thermal conductivity material mentioned above. For example, an organic polymer film, such as polyimide or Teflon, has a thermal conductivity coefficient of only 1 $W \cdot -1 \cdot K^{-1}$. Therefore the low dielectric constant material is not suitable for a circuit board on which heat-generating devices are to be mounted to a high integration density.

As described above, it is substantially impossible at the present stage to achieve, using single material, both requirements for a circuit board, i.e., a high heat-radiating property and a high-speed signal transmission. Hence, it is proposed that the two requirements be satisfied by forming a composite circuit board constituted by a substrate formed of a material having a high thermal conductivity and a thin film formed of a low dielectric constant material coated thereon. In this case also, however, the thin film, on which electronic devices are directly mounted, must have not only a low dielectric constant but also a relatively high thermal conductivity. In addition, the composite circuit board has the following problems:

In general, a thin film of a dielectric material is formed on the surface of a substrate through a thin film forming process, such as vacuum deposition, sputtering, a cluster ion beam method, ion plating, ion mixing and CVD. The dielectric thin film formed through the thin film process has an internal residual stress, such as a tensile stress, depending on process conditions. Since the dielectric thin film having such a residual stress has low adhesion to the substrate, it is liable to be removed from the substrate. Similarly, when a wiring pattern is formed on the dielectric thin film having residual stress, as the adhesion between the film and the wiring pattern is low, delamination of the wiring pattern may arise. Further, when a dielectric film is formed on a substrate using a thick film process, a similar internal stress remains in the dielectric film due to contraction in a sintering process.

SUMMARY OF THE INVENTION

The present invention has been made in consideration of the above problems, and its object is to provide a circuit board which satisfies the two requirements of a high heat radiating property and a high speed signal transmitting property and which also solves the problem of delamination by means of a composite circuit board structure.

The object can be achieved by a circuit board comprising a substrate; at least one dielectric film formed on the substrate and made of at least one selected from the group consisting of AlN, BN, diamond, diamond-like carbon, BeO and SiC, said dielectric film having a porosity of 5 to 95% by volume; and at least one wiring metal film formed on the dielectric film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a cross-sectional view showing an embodiment in which the present invention is applied to a circuit board having a multilayered wiring constitution;

FIGS. 4 to 8 are cross-sectional views showing circuit boards according to other embodiments of the present invention; and FIG. 9 is a cross-sectional view showing a circuit board as a comparative example of the present invention.

DETAILED DESCRIPTION OF THE PREFERRED EMBODIMENTS

Figure 1A:
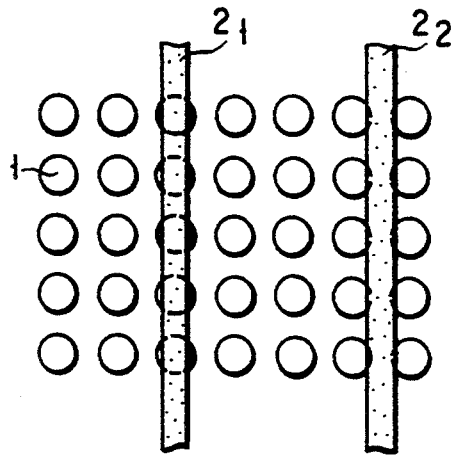
FIGS. 1A and 1B are diagrams showing two ways of arranging pores having a circular plane figure, in a dielectric film used in a circuit board of the present invention.

Embodiments of the present invention will now be described in detail.

The substrate of the present invention can be formed of an inorganic material such as Si, AlN, BN, diamond, BeO, SiC and $SiO_2$. The wiring metal film can be formed of a material used in a conventional circuit board, for example, Au, Cu, Al, Ag or TiN.

The circuit board of the present invention is most obviously characterized in that a composite structure, in which a dielectric film and a wiring metal film are successively deposited on a substrate, is employed and that the dielectric film has porosity of 5 to 95% by volume.

In the composite structure, adhesion between the substrate and the dielectric film as well as adhesion between the dielectric film and the wiring metal film is low, as described above, due to the internal residual stress such as the tensile stress in the dielectric film. However, the present inventors discovered that the residual stress in the dielectric film is reduced by providing the porosity of the above-mentioned range in the dielectric film, and have achieved the present invention based on that discovery. In other words, since the internal residual stress is low in the dielectric film of the present invention which has a porosity of 5 to 95% by volume, the dielectric film adheres with high strength to the substrate and the wiring metal film of the circuit board. Therefore, the dielectric film is prevented from being removed from the substrate and the wiring metal film is prevented from being removed from the dielectric film.

In the present invention, the porosity of the dielectric film is limited to 5 to 95% by volume for the following reasons: if the porosity is less than 5%, since an internal stress remains in the dielectric film, the adhesion strength of the dielectric film to the substrate and the wiring metal film is low, resulting that the dielectric film may be removed from the substrate and the wiring film may be delaminated; and if the porosity exceeds 95%, it becomes difficult to control the shape of pores and to form a dielectric film of a uniform thickness. A desirable range of the porosity is 5 to 70% by volume and a more desirable range is 9 to 65% by volume.

The pores distributed in the dielectric film contain gas. The gas is not limited to a particular one, so long as it does not corrode the dielectric film made of the high thermal conductivity materials. For example, the gas can be air, nitrogen gas, oxygen gas or hydrogen gas. However, it is desirable that the gas contains at least one elements which are members of group 0 of the periodic table, i.e., Ar, He, Ne, Kr, Xe and Rn. The group 0 elements are advantageous because these element are adsorbed to the interior surface of the pores to increase the resistivity of the dielectric film. To obtain this advantage, it is desirable that the partial pressure of the group 0 element be at least $1 \times 10^{-2}$ Pa.

Another advantage of the circuit board according to the present invention is that the dielectric film as described above can satisfy the two requirements for a circuit board, i.e., a high heat-radiating property and a high-speed signal transmission.

First, the heat-radiating property of the dielectric film of the present invention will be described. As mentioned before, the dielectric film is formed of AlN, BN, diamond, diamond-like carbon, BeO or SiC. The diamond-like carbon means an amorphous diamond in which hydrogen is dissolved to form a solid solution. These dielectric materials each have a high thermal conductivity of 30 to 3000 $W \cdot m^{-1} \cdot K^{-1}$. In contrast, conventional low-dielectric constant materials, such as $SiO_2$, polyimide and $Al_2O_3$, merely have a thermal conductivity of 0.01 to 21 $W \cdot m^{-1} \cdot K^{-1}$ as mentioned above. Thus, since the dielectric film of the present invention has a much higher (30 to 3000 times) thermal conductivity than the conventional low dielectric constant materials, the dielectric film of the present invention can provide the considerably improved heat-radiating property to the circuit board, compared with the conventional low dielectric constant film.

Secondly, with regard to the signal transmission speed, the materials of the dielectric film of the present invention, i.e., AlN, BN, diamond, diamond-like carbon, BeO and SiC, are disadvantageous, since the dielectric constants of these materials are 2.5 to 15 times as high as those of the conventional low dielectric constant materials, as described above. However, since the dielectric film of the present invention contains pores at the level of 5 to 95% by volume, the dielectric constant of the thin film is much lower than that of the material itself. By virtue of the pores distributed in the dielectric film, it is possible to obtain a low dielectric constant property (e.g., a dielectric constant of 2 to 3) the same as or more advantageous than that of the conventional low dielectric constant materials.

As described above, the dielectric film of the present invention can achieve both requirements for a circuit board: a high thermal conductivity and a low dielectric constant, which cannot be achieved by a conventional dielectric film formed of a single material. Hence, the heat radiating property of the circuit board can be improved and the signal transmission speed can be increased. Thus, since the circuit board of the present invention is advantageous in having both the heat radiating property and the signal transmission speed due to an inherent characteristic of the dielectric film, it is possible to apply the circuit board to a highly-integrated semiconductor device which is operated at high speed.

Now, a method for forming the dielectric film of the present invention and parameters of the film will be described in detail.

The dielectric film according to the present invention, having a porosity of 5 to 95% by volume, is formed by means of a conventional thin film forming process, such as vacuum deposition, sputtering, a cluster ion beam method, ion plating, ion mixing and CVD. The thin film process is highly advantageous in the formation of a thin film like the dielectric thin film of the present invention, in which a number of pores are distributed intentionally; because, in the thin film forming method, ambient gas is taken into the film during a film forming process, resulting in the formation of pores. Therefore, the shape, the size, the range of distribution and the content of pores can be easily controlled by changing conditions of the thin film process. With the above method, a porosity of 30% by volume or higher can be easily achieved, and further, even a porosity of about 70% by volume can be achieved, depending on the conditions.

There is another method for forming a porous dielectric film. According to the method, gas is introduced into a thick film material slurry shaving a high viscosity, thereby producing air bubbles therein, and the slurry containing the gas bubbles is formed into a thick film, which is sintered and set up. However, this method is not suitable for forming the dielectric film of the present invention for the following reasons: In this method, the ratio of the bubbles formed in the gas introducing process is determined by the balance of the viscosity of the slurry and the buoyancy of the gas bubbles, i.e., a high viscosity is required to obtain a high porosity. However, since the viscosity of the slurry of the thick film material has an upper limit, a satisfactorily high porosity cannot be obtained. For example, a glass ceramic substrate obtained by the method has a volume porosity of 20% at most. In addition, it is very difficult to control the shape, size and the distribution range of pores in this method.

The pores distributed in the dielectric thin film during the thin film forming step can be either continuous open pores or discontinuous closed pores. In the volume porosity range of 5 to 70%, most pores are closed. However, when open pores which communicate with the exterior are formed in a surface region of the dielectric thin film, the humidity resistance may be degraded or the resistivity and the breakdown voltage of the dielectric film may be lowered. To avoid these problems, it is desirable that a polymer such as polyimide or Teflon be embedded into the open pores formed in the surface region of the dielectric thin film.

When pores in the dielectric film are formed by controlling conditions of the thin film method, as described above, it is desirable that the final thermal conductivity of the dielectric thin film be 21 $W \cdot m^{-1} \cdot K^{-1}$ to 1000 $W \cdot m^{-1} \cdot K^{-1}$. If the thermal conductivity is less than 21 $W \cdot m^{-1} \cdot K^{-l}$, the porosity will exceed the upper limit, with the result that a satisfactory heat radiating property of the circuit substrate cannot be obtained. On the other hand, if the thermal conductivity exceeds 1000 $W \cdot m^{-1} \cdot K^{-l}$, the porosity will be less than the lower limit of the above-mentioned range, with the result that the adhesion between the thin film and the substrate and between the thin film and the wiring metal film may be reduced and the thin film is liable to be removed from the substrate or the wiring metal film. It is also desirable that the thickness of the dielectric thin film range from 100 nm to 500 μm. If the thickness is less than 100 nm, it is difficult to make the thickness uniform, and if the thickness exceeds 500 μm, the internal stress may be increased.

According to the present invention, in order to obtain a dielectric thin film of porosity described above, the following improved method is more effective than the above-mentioned process condition of the thin film process. The improved method comprises the steps of forming a first dielectric film on a substrate and forming a number of minute pores having predetermined diameters and depths by processing the first dielectric film; and depositing a second dielectric film on the first dielectric film, thereby closing the openings of the minute pores.

In this improved method, since the pores are formed in a process different from the process adopted for forming the dielectric film, the following advantages can be obtained. First, a porosity volume of 90% or higher can be easily obtained, Secondly, the size and shape of pores can be accurately controlled. Thirdly, it is possible not only to uniformly form pores over the entire dielectric film, but also to form pores only in limited portions (e.g., a region under the wiring layer) of the dielectric film, without forming pores in another portions (e.g., under the capacitor electrode). Fourthly, the thermal conductivity of the dielectric film can be improved as compared to the case in which the pores in the dielectric film are formed by controlling the conditions of the thin film process because of the following reasons. The pores formed in the dielectric thin film by the process control of the thin film method are very fine, with dimensions in the nanometer order. Therefore, if the porosity is increased, the crystallinity of the dielectric film will be degraded, resulting in a reduction of thermal conductivity. In contrast, according to the above improved method, since it is unnecessary that each of the dielectric films contains gas bubbles when it is formed, the crystallinity of the dielectric film itself is satisfactory and the thermal conductivity is not reduced.

In the above improved method, printing or thermal spraying, as well as the thin film method, can be employed as a method for forming first and second dielectric films. Further, for processing the first dielectric film to form the minute pores, the following methods can be employed. A first method is selective etching of a predetermined region of the dielectric film by photolithography. In this case, either wet etching or dry etching can be employed; however, a RIE (reactive ion etching) is desirable. A second method is physical or mechanical perforation of the dielectric film. Physical perforation can be performed by using a probe of an interatomic microscope or a scanning tunneling microscope. In a third method, a metal pattern is formed on a region in which minute pores are to be formed by using plating or the like, then the dielectric film is formed on the metal pattern, followed by selectively etching the metal pattern off.

Irrespective of the method used to form minute pores in the first dielectric film, it is necessary that the diameter of minute pores be 10 μm or less. If the diameter is larger than 10 μm, the openings of the pores cannot be completely closed, when the second dielectric film is formed on the first dielectric film, resulting in open pores being formed. In a case where pores are open, the humidity resistance is degraded. In addition, the resistivity and the breakdown voltage of the dielectric thin film are reduced. Otherwise, the minute pores may be completely filled with the second dielectric film, i.e., no pores are formed.

The shape of pores may be either circular or polygonal in the plan view. However, in order that the second dielectric film completely close the openings of minute pores, it is desirable that the aspect ratio (depth/diameter) of the minute pores be 0.1 or greater. The greater the aspect ratio (i.e., the deeper the minute pores), the easier the pores are closed by the second dielectric film. Thus, the upper limit of the aspect ratio is determined by a film critical thickness depending on factors of the dielectric film, for example, the internal stress. The critical thickness is about several millimeters in the case of a film having a satisfactory quality, although it varies in accordance with a material of a film and a film forming method.

Figure 1B:
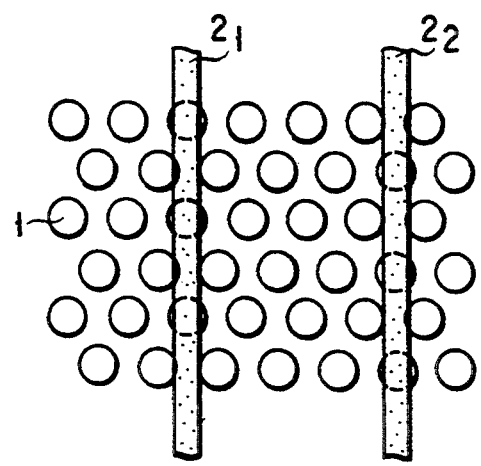

In the improved method, it is possible to arrange a number of minute pores two-dimensionally in a desired fashion. For example, when pores 1 having a circular shape in the plan view are to be arranged at regular intervals, the pores 1 can be arranged in row and column directions like a matrix as shown in FIG. 1A, or the positions of the pores 1 in the adjacent rows can be shifted by a half pitch in the row direction, as shown in FIG. 1B. However, the arrangement shown in FIG. 1B is preferable for the following reasons. First, a higher porosity can be obtained from the arrangement of FIG. 1B, according to the closest packing of the pores 1. Secondly, in the case of the same porosity, the mechanical strength of the dielectric film can be greater in the arrangement of FIG. 1B than that of FIG. 1A, because all the paths of the dielectric matrix in the arrangement of FIG. 1A are linear, whereas the paths in the column direction are zigzag in the arrangement of FIG. 1B. Thirdly, when wiring layers $2_1$ and $2_2$ are formed on the dielectric film, the adhesion strength between the dielectric film and the wiring layers $2_1, 2_2$ can be more uniform in the arrangement of FIG. 1B. This is evident from the fact that the area of the pores under the layer $2_1$ is completely different from that of the pores under the layer $2_2$ in FIG. 1A, whereas the areas of the pores under the layers $2_1$ and $2_2$ are the same in FIG. 1B. These effects can be obtained, irrespective of the degree of shift of the pores 1; however, the greatest effect is obtained, when the shift degree of pores 1 is a half pitch in the rows.

Figure 2A:
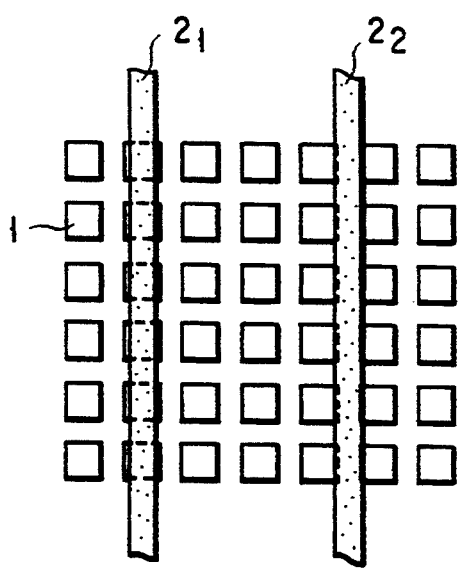
FIGS. 2A and 2B are diagrams showing two ways of arranging pores having a rectangular plane figure, in a dielectric film used in a circuit board of the present invention.
Figure 2B:
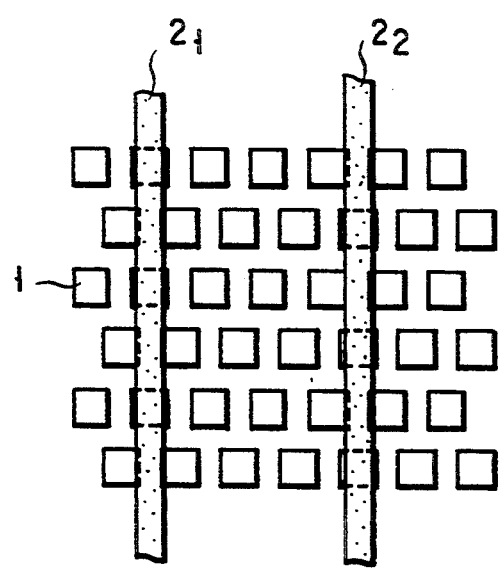

Pores having a rectangular shape in the plan view can be also arranged as shown in either FIG. 2A or FIG. 2B. However, the arrangement of FIG. 2B, in which the positions of the pores 1 in the adjacent rows are shifted by a half pitch in the row direction, is preferable. In this case, both the arrangements in FIGS. 2A and 2B are equivalent from the viewpoint of the porosity, since pores are arranged in the closest-packing fashion in both arrangements. However, from the viewpoint of the mechanical strength of the dielectric film and the strength of adhesion of the dielectric film to the wiring layers $2_1$ and $2_2$, the arrangement shown in FIG. 2B is more advantageous for the same reasons described above.

The entire constitution of the circuit board of the present invention will now be described.

The circuit board of the present invention is realized, in general, as a composite structure in which a dielectric thin film pattern is formed on a substrate and a wiring metal film pattern (circuit pattern) is formed on the dielectric thin film. It is possible to form multilayered dielectric thin films and multilayered wiring metal films alternately deposited on the substrate. In a case of the multilayered wiring structure, the lowermost wiring metal film can be deposited directly on the substrate without a dielectric thin film interposed therebetween.

FIG. 3 shows an embodiment in which the present invention is applied to a circuit board having the multi-layered wiring structure. In this embodiment, used is a dielectric thin film having a certain porosity mentioned above, which is obtained by a thin film process under controlled conditions. In FIG. 3, a reference numeral 11 denotes a substrate. Wiring metal films 12, 14, 16 and 18 of a predetermined pattern are successively deposited on the substrate, with dielectric thin films 13, 15 and 17 interposed between one wiring metal film and another. Contact holes 19, 20 and 21 are formed in the dielectric thin films 13, 15 and 17, respectively. The wiring metal films 12, 14 and 16 are connected with one another through the contact holes. The dielectric thin films 13, 15 and 17 are formed of at least one of AlN, BN, diamond, diamond-like carbon, BeO and SiC, as described above, and the porosity thereof is set within a range from 5 to 95% by volume.

If necessary, a connection layer or a barrier layer may be formed between the wiring metal films 12, 14, 16 and 18 and the dielectric thin films 13, 15 and 17. The connection layer may be formed of a thin film made of, for example, Ti, Cr, Nb, Zr, Hf or Ta. The barrier layer may be formed of a thin film made of, for example, Ni, Mo, Pt, TiN or W. Further, if necessary, metal members such as input/output leads and a seal ring may be mounted on the surface of the dielectric thin film 17 or the wiring metal film 18. These metal members are mounted thereon by brazing or soldering. In this case, Ag-Cu, Ag-Cu-Ti, Au-Sn, or Pb-Sn alloy can be used as a brazing or soldering material.

The circuit board shown in FIG. 3 is advantageous in heat radiating property, since the dielectric thin films 13, 15 and 17 have a high thermal conductivity. In addition, and a low dielectric constant. It is also advantageous in a speed at which a signal is transmitted through the wiring metal films 12, 14, 16 and 18, because the dielectric thin films have a low dielectric constant. Thus, the circuit board has an efficient circuit performance. Furthermore, since, in the circuit board shown in FIG. 3, the internal stress of the dielectric thin films 13, 15 and 17 is low, the strength of adhesion of the dielectric films to the substrate 11 or the wiring metal films 12, 14, 16 and 18 is high, thereby preventing delamination.

The circuit board according to the embodiment shown in FIG. 3 can be manufactured in the following manner, for example.

First, a dielectric thin film 13, in which pores are distributed, is formed by using the thin film process on a substrate 11 on which a wiring metal film 12 is formed. The thin film process can be, for example, vacuum deposition, sputtering, a cluster ion beam method, ion plating, ion mixing or CVD as previously described. If necessary, the porosity in the dielectric thin film 13 can be controlled by changing various conditions such as the temperature of the substrate 11, the atmosphere, the degree of vacuum and the film forming speed. The material of the dielectric thin film 13 is selected from a group consisting of AlN, BN, diamond, diamond-like carbon, BeO and SiC, so as to obtain a desired thermal conductivity of the circuit board.

Subsequently, the dielectric thin film is processed into a predetermined pattern by, for example, a photolithography method, a lift-off method or a printing method. In practice, one of the methods is selected in accordance with the wiring pitch, the via dimensions in the multilayered wiring, the process accuracy such as dimensions in connecting portions, and the requirements for metallization in forming wiring layers, which are required in a particular example. Contact holes 19 are formed during the above process.

Then, the processed dielectric thin film 13 is subjected to metallization, thereby forming a wiring metal film 14. The wiring metal film 14 may be formed of Au, Cu, Al or the like. The wiring metal film 14 is processed in the manner as in the process of forming the dielectric film 13, thereby forming a predetermined circuit pattern.

Similarly, dielectric thin films 15 and 17 and wiring metal films 16 and 18 are alternately formed. Thus, a circuit board of a multilayered wiring structure as shown in FIG. 3 can be obtained. If necessary, a connection layer or a barrier layer may be successively formed on the wiring layers 14 and 16.

In the above embodiment described with reference to FIG. 3, dielectric films 13, 15 and 17 having a desired porosity are formed by using a thin film process in which the process conditions are controlled for achieving the desired porosity. However, it is possible to form the dielectric films 13, 15 and 17 by using the above-mentioned improved method in which the desired porosity is achieved by processing preformed dielectric films. In the case of employing the improved method for achieving the desired porosity, a circuit board shown in FIG. 3 can be manufactured in the same manner as described above, except for the method for forming the dielectric films 13, 15 and 17.

Examples of the present invention will now be described in detail. The following examples are presented so that the invention can be easily understood, and they does not limit the scope of the invention.

EXAMPLE 1 (Samples Nos. 1 to 19)

Dielectric thin films 1 to 19, in which pores are distributed, were formed on substrates by a sputtering or CVD method under conditions indicated in Tables 1 and 2. The dielectric thin films 1 to 18 are relate to working examples of the present invention and the dielectric thin film 19 relates to a comparative example. An AlN substrate was used as the substrate, and AlN, BN, diamond, diamond-like carbon or SiC was used as a dielectric material. The thicknesses of the dielectric thin films 1 to 19 are as shown in Tables 1 and 2.

More specifically, a laminated film consisting of Ti and Pt films, which serves as a lower electrode, was formed on an AlN substrate by using a sputtering method. The Ti film is 50 nm thick and the Pt film is 150 nm thick. A dielectric thin film 1 to 19 were formed on the surface of the lower electrode, as described above. Subsequently, a laminated film constituted by a Ti film and a Pt film (respectively having thicknesses of 100 nm and 300 nm) was formed on the dielectric thin film by the sputtering method. The laminated film was patterned into a size of 500 μm square, thereby forming an upper electrode.

The dielectric characteristic (dielectric constant) and the thermal conductivity of each of the dielectric thin films 1 to 19 were measured using the upper and lower electrodes as measuring electrodes. To obtain the thermal conductivity, the thermal diffusivity was measured first by using AC calorimetric method, and the thermal conductivity was calculated from the measured value. The cross section of each of the dielectric thin films 1 to 19 was observed through a TEM and SEM to measure the area of pores distributed in the dielectric thin film, and the porosity (volume percentage) was calculated from the measured value. Further, the 10 warping of the substrate was measured with a film thickness measurer, and the internal stress of the dielectric thin film was calculated from the measured value.

The results were shown in the following Table 1.

TABLE 1

| No. | Film forming method | Material of film | Material gas, flow rate | Target, Power | Substrate temperature |
|---|---|---|---|---|---|
| 1 | Sputtering | AlN | Netrogen gas:Ar gas = 1:1 | Al, 2kW | 200° C. |
| 2 | Sputtering | AlN | Netrogen gas:Ar gas = 1:1 | Al, 3kW | 300° C. |
| 3 | Sputtering | AlN | Netrogen gas:Ar gas = 1:1 | Al, 2kW | 100° C. |
| 4 | CVD | AlN | Tri-isobutyl aluminum:Ar:NF$_4$ = 4:20000:3300 | —, 900W Microwave | 400° C. |
| 5 | CVD | AlN | Tri-isobutyl aluminum:Ar:NF$_4$ = 4:20000:3300 | —, 900W Microwave | 250° C. |
| 6 | Ion mixing | AlN | Ar, Oxygen, Nitrogen assist | Al, Leading voltage 100 keV, Ionization current 3mA, Deposition | 100° C. |
| 7 | Sputtering | SiC | Ar:C$_3$H$_8$ = 4:3 | Si, 1kW | 150° C. |
| 8 | CVD | Diamond | CH$_4$:H$_2$ = 1:25 | —, 2kW Microwave | 600° C. |
| 9 | CVD | Diamond | CH$_4$:H$_2$ = 1:20 | —, 3kW Microwave | 300° C. |
| 10 | CVD | Diamond | CH$_4$:H$_2$ = 1:30 | —, 2kW Microwave | 250° C. |
| 11 | CVD | Diamond | CH$_4$:H$_2$ = 1:30 | —, 1.5kW Microwave | 150° C. |
| 12 | CVD | Diamond-like carbon | CH$_4$:H$_2$ = 1:40 | —, 2kW Microwave | 100° C. |
| 13 | CVD | Diamond-like carbon | CH$_4$:H$_2$ = 1:45 | —, 2kW Microwave | 100° C. |
| 14 | Sputtering | BN | Netrogen gas:Ar gas = 1:1 | BN, 4kW | 220° C. |
| 15 | Sputtering | BN | Netrogen gas:Ar gas = 1:1 | BN, 3kW | 200° C. |
| 16 | CVD | Diamond-like carbon | CH$_4$:H$_2$ = 1:45 | —, 2kW Microwave | 100° C. |
| 17 | CVD | Diamond-like carbon | CH$_4$:H$_2$ = 1:45 | —, 2kW Microwave | 150° C. |
| 18 | CVD | Diamond-like carbon | CH$_4$:H$_2$ = 1:45 | —, 2kW Microwave | 100° C. |
| 19 | CVD | Diamond-like carbon | CH$_4$:H$_2$ = 1:45 | —, 2kW Microwave | 200° C. |

| No. | Pressure Pa | Film thickness | Dielectric constant | Thermal conductivity | Porosity % | Internal stress MPa |
|---|---|---|---|---|---|---|
| 1 | 3 | 3 μm | 4.7 | 100 | 40 | −2 |

TABLE 1-continued

| | | | | | | |
|---|---|---|---|---|---|---|
| 2 | 6 | 10 μm | 2.7 | 48 | 70 | −3 |
| 3 | 1.5 | 20 μm | 6.2 | 195 | 20 | −3 |
| 4 | 60 | 100 μm | 7.2 | 220 | 10 | −6 |
| 5 | 700 | 100 μm | 3.3 | 68 | 60 | −2 |
| 6 | $1 \times 10^{-3}$ | 1 μm | 4.7 | 120 | 40 | −2 |
| 7 | 2 | 3 μm | 15 | 68 | 60 | −2 |
| 8 | 30k | 5 μm | 3.0 | 370 | 50 | −1 |
| 9 | 80k | 10 μm | 2.5 | 280 | 60 | −1 |
| 10 | 10k | 8 μm | 4.0 | 590 | 30 | −1 |
| 11 | 2k | 10 μm | 5.1 | 900 | 10 | −3 |
| 12 | 1k | 10 μm | 4.9 | 500 | 10 | −3 |
| 13 | 2k | 10 μm | 4.3 | 690 | 20 | −2 |
| 14 | 5 | 10 μm | 4.4 | 320 | 30 | −1 |
| 15 | 3 | 13 μm | 5.7 | 10 | 10 | −3 |
| 16 | 3.5k | 10 μm | 3.8 | 510 | 30 | −1 |
| 17 | 5k | 100 μm | 2.8 | 300 | 500 | −1 |
| 18 | 7k | 10 μm | 2.8 | 220 | 60 | −1 |
| 19 | 900 | 10 μm | 5.7 | 1000 | 3 | 35 |

As clear from the tables, the porosities of the dielectric thin films 1 to 18 are within the range of the present invention (5 to 70% by volume). Accordingly, both a high thermal conductivity and a low dielectric constant are achieved. In addition, the internal stress is small. Hence, it follows that the heat radiating property and the signal transmission speed are high, and defects such as delamination do not easily occur in the circuit boards having the dielectric thin films 1 to 18 (the working examples of the present invention).

In contrast, the dielectric thin film 19 has a porosity less than the range of the present invention, and a particularly great internal stress. Therefore, the dielectric thin film is liable to be easily removed from the substrate and the wiring metal films, in the circuit board having this dielectric thin film (the comparative example).

EXAMPLE 2 (Samples Nos. 20 to 24)

In this example, circuit boards having the cross-sectional structure shown in FIG. 4 were prepared. In FIG. 4, a reference numeral 31 denotes an Si substrate; 32 an SiO₂ film; 33 a Ti connecting film; 34 a Cu conductive film; 35 an AlN dielectric film; 36 pores; 37 a Ti connecting film; and 38 a Cu conductive film.

First an $SiO_2$ film 32 was formed on a surface of an Si substrate 31. Then, a sputtering process targeting Ti was performed in an Ar gas atmosphere under a pressure of 0.5 Pa, thereby forming a Ti connecting film 33 on the $SiO_2$ film 32. In this process, the sputtering power was 2 kW and the substrate temperature was 200° C. Subsequently, a sputtering process targeting Cu was performed in an Ar gas atmosphere under a pressure of 0.5 Pa, thereby forming a Cu conductive film 34 on the Ti connecting film 33. In this process, the sputtering power was 3 kW and the substrate temperature was 200° C.

Thereafter, a sputtering process targeting Al was performed in a gas atmosphere containing nitrogen, thereby forming an AlN dielectric film 35 having a thickness D on the Cu conductive film 34 (the thickness D is shown in Table 2 indicated afterward). In this process, the sputtering power was 3 kW and the substrate temperature was 200° C. An Ar gas and a nitrogen gas were used as the gas atmosphere in the ratio of flow rates 5/1 and the sputtering pressure was maintained at 0.3 Pa. Subsequently, the AlN dielectric film 35 was etched by means of ordinary photolithography, thereby forming pores 36 having a square shape in the plan view. In the etching process, a RIE using Ar, Cl, Br and $CF_4$ as an etchant was employed and the etching power was 250 W. The size of a pore 36 was A μm×A μm×B μm, and the interval between pores was C μm (the values of A, B and C are indicated in Table 2). The arrangement of the pores 36 is as shown in FIG. 2B. Then, an AlN dielectric film was deposited by the sputtering under the same conditions as described above, thereby closing the openings of the pores 36. At this time, the pores were filled with an Ar-containing gas. Partial pressure of Ar in the filled gas is equal to that of sputtering atmosphere equilibrated at the sputtering pressure.

A Ti connecting film 37 and a Cu conductive film 38 were successively formed by sputtering. The conditions of the sputtering are the same as those in the process 10 for forming the Ti connecting film 33 and the Cu conductive film 34. Then, a laminated film constituted by the Ti connecting film 37 and the Cu conductive film 38 was patterned into a size of 100 μm×100 μm, thus forming an upper electrode.

With respect to Samples Nos. 20 to 24 thus obtained, the dielectric constant, the porosity, the resistivity, the crystallinity of the dielectric film 35, the moisture resistance and the thermal conductivity were evaluated. The results of the evaluation are shown in Table 2. The dielectric constant was measured under the condition of 10 MHz and the resistivity was measured under the condition of an applied voltage of 10 V. The cross section of the obtained sample was observed by an SEM, and the porosity was calculated. Regarding the crystallinity, the sample, on which an upper electrode has not been formed, was first subjected to X-ray diffraction, and then a half band width ($w_1$) of a main peak obtained by the diffraction was compared with a half band width ($w_2$) obtained by the X-ray diffraction of bulk solid AlN in the same direction, to evaluate the crystallinity. The value of $w_1/w_2$ is indicated in Table 2. Regarding the moisture resistance, the samples were kept in steam of 100° C. for 500 hours, and thereafter the resistivity of each sample was measured under the atmosphere. A sample, which has a resistivity of $1 \times 10^9$ Ω·cm or higher, was regarded as acceptable. Regarding the thermal conductivity, a thermal diffusivity of the sample was measured by using AC calorimetric method, and the thermal conductivity was calculated from the thermal diffusivity.

As clear from the results indicated in Table 2, each of Samples Nos. 20 to 24 according to the present invention has a high porosity and a high thermal conductivity, satisfactory crystallinity and moisture resistance, and a low dielectric constant.

EXAMPLE 3 (Samples Nos. 25 to 29)

In this example, circuit boards having the cross-sectional structure shown in FIG. 5 were prepared. In FIG. 5, a reference numeral 41 denotes an AlN substrate; 42 a W-wiring layer; 43 a Ti connecting film; 44 an Al conductive film; 45 an AlN dielectric film; 46 pores; and 47 an Al conductive film.

In this example, an AlN substrate 41, in which a W-wiring layer 42 had been preformed, was used. First, a sputtering process targeting Ti was performed in an Ar gas atmosphere under a sputtering pressure of 1 Pa, thereby forming a Ti connecting film 43 on the AlN substrate 41. In this process, the sputtering power was 2 kW and the substrate temperature was 200° C. Subsequently, a sputtering process targeting Al was performed in an Ar gas atmosphere under a sputtering pressure of 1 Pa, thereby forming an Al conductive film 44 on the Ti connecting film 43. In this process, the sputtering power was 3 kW and the substrate temperature was 200° C.

Thereafter, a sputtering process targeting Al was performed in a gas atmosphere containing nitrogen, thereby forming an AlN dielectric film 45 having a thickness D on the Al conductive film 44 (the thickness D is shown in Table 2 indicated later). In this process, the sputtering power was 3 kW and the substrate temperature was 200° C. A Ne gas and a nitrogen gas were used as the gas atmosphere in a ratio of flow rates 5/1 and the sputtering pressure was maintained at 0.3 Pa. Subsequently, pores 46 having a square shape in the plan view were formed in the AlN dielectric film 45 in the same manner as in Example 2 (Samples Nos. 20 to 24). The size of a pore 46 was A $\mu$m $\times$ A $\mu$m $\times$ B $\mu$m, and the interval between pores was C $\mu$m (the values of A, B and C are indicated in Table 2). The arrangement of the pores 46 is as shown in FIG. 2B. Then, an AlN dielectric film was deposited by the sputtering under the same conditions as described above, thereby closing the openings of the pores 46. At this time, the pores were filled with an Ne-containing gas having Ne partial pressure which is equal to that of sputtering atmosphere equilibrated at the sputtering pressure.

Thereafter, an Al conductive film 47 was formed by the sputtering under the same conditions as the process for forming the Al conductive film 44. The Al conductive film 47 was patterned into a size of 100 $\mu$m $\times$ 100 $\mu$m, thus forming an upper electrode.

With respect to Samples Nos. 25 to 29 thus obtained, the dielectric constant, the porosity, the resistivity, the crystallinity of the dielectric film, the moisture resistance and the thermal conductivity were evaluated in the same manner as in Example 2 (Samples Nos. 20 to 24). The results of the evaluation are shown in Table 2.

As clear from the results indicated in Table 2, each of Samples Nos. 25 to 29 according to the present invention has a high porosity and a high thermal conductivity, satisfactory crystallinity and moisture resistance, and a low dielectric constant.

EXAMPLE 4 (Samples Nos. 30 to 34)

In this example, circuit boards having the cross-sectional structure shown in FIG. 6 were manufactured. In FIG. 6, a reference numeral 51 denotes an Si substrate; 52 an SiO$_2$ film; 53 an Al conductive film; 54 a diamond-like carbon dielectric film; 55 pores; and 56 an Al conductive film.

An Si substrate 51, on which an SiO$_2$ film 52 had been formed, was prepared. A sputtering process targeting Al was performed in an Ar gas atmosphere under a sputtering pressure of 1 Pa, thereby forming a Al conductive film 53 on the SiO$_2$ film 52. In this process, the sputtering power was 2 kw and the substrate temperature was 200° C.

Subsequently, a diamond-like carbon dielectric film 54 having a thickness D was formed on the Al conductive film 53 by a plasma CVD using microwaves of a power of 2 kW (the thickness D is shown in Table 2). The conditions of the CVD were the substrate temperature of 400° C., the pressure of 300 Pa, and the ratio of flow rates of Ar gas to CH$_4$ gas 25/1. Then, the diamond-like carbon dielectric film 54 was etched by means of ordinary photolithography, thereby forming pores 55 having a square shape in the plan view. In the etching process, a RIE method using Ar and O as an etchant (the ratio of flow rates is 10) was employed and the etching power was 250 W. The size of a pore 55 was A $\mu$m $\times$ A $\mu$m $\times$ B $\mu$m, and the interval between pores was C $\mu$m (the values of A, B and C are indicated in Table 2). The arrangement of the pores 55 is as shown in FIG. 2B. Thereafter, a diamond-like carbon dielectric film was deposited by the CVD under the same conditions as described above, and then etched under the above-mentioned etching conditions, thereby forming pores 55 of the above-mentioned size. The deposition and etching processes were repeated, until the thickness of the dielectric film 54 became 20 $\mu$m. When the thickness of the dielectric film reached 20 $\mu$m, a diamond-like dielectric film was deposited by the CVD under the same conditions as described above, thereby closing the openings of the pores 55. At this time, the pores were filled with an Ar-containing gas having Ar partial pressure equal to that of the sputtering atmosphere equilibrated at the sputtering pressure.

Thereafter, an Al conductive film 56 was formed by the sputtering under the same conditions as the process for forming the Al conductive film 53. The Al conductive film 56 was patterned into a size of 100 $\mu$m $\times$ 100 $\mu$m, thus forming an upper electrode.

With respect to Samples Nos. 30 to 34 thus obtained, the dielectric constant, the porosity, the resistivity, the crystallinity of the dielectric film, the moisture resistance and the thermal conductivity were evaluated in the same manner as in Example 2 (samples Nos. 20 to 24). The results of the evaluation are shown in Table 2.

As clear from the results indicated in Table 2, each of Samples Nos. 30 to 34 according to the present invention has a high porosity and a high thermal conductivity, satisfactory crystallinity and moisture resistance, and a low dielectric constant.

EXAMPLE 5 (Samples Nos. 35 to 39)

In this example, circuit boards having the cross-sectional structure shown in FIG. 7 were prepared. In FIG. 7, a reference numeral 61 denotes an AlN substrate; 62 an internal W-wiring layer; 63 a W conductive film; 64 an AlN dielectric film; 65 pores; and 66 a W conductive film.

In this example, an AlN substrate 61, in which an internal W-wiring layer 62 had been formed and on which a W conductive film 63 had been formed, was used.

First, an AlN thick film paste was printed on the W conductive film 63 and sintered in a nitrogen atmosphere, thereby forming an AlN dielectric film 64. The AlN thick film paste was prepared by adding AlN, yttrium oxide and an acrylic binder into a-Terpineol ($CH_3C_6H_8(CH_3)_2OH$) solvent. The conditions of sintering were the temperature of 1850° C. and the period of time of 1 hour.

The surface of the AlN dielectric film was mirror-polished to a surface roughness of 30 nm. Subsequently, the AlN dielectric film 64 was etched by means of selective wet etching using a 1 wt % solution of tetramethylammonium hydroxide as an etchant, thereby forming pores 65, having a square shape in the plan view, in the AlN dielectric film 65. The size of a pore 65 was A $\mu m \times A$ $\mu m \times B$ $\mu m$, and the interval between pores was C $\mu m$ (the values of A, B and C are indicated in Table 2). The arrangement of the pores 65 is as shown in FIG. 2B. Then, the above-mentioned AlN thick film paste was printed on the AlN dielectric film 64 in a He gas atmosphere, thereby closing the openings of the pores 65. At this time, the pores were filled with a He gas. Further, a W thick film paste was printed on the AlN dielectric film 64, thereby forming a W conductive film 66. The W thick film paste was prepared by adding W and an acrylic binder into α-Terpineol ($CH_3C_6H_8(CH_3)_2OH$) solvent. The W conductive film 66 was subjected to sintering at a temperature of 1850° C. for 1 hour in a nitrogen gas atmosphere.

With respect to Samples Nos. 35 to 39 thus obtained, the dielectric constant, the porosity, the resistivity, the crystallinity of the dielectric film, the moisture resistance and the thermal conductivity were evaluated in the same manner as in Example 2 (Samples Nos. 20 to 24). The results of the evaluation are shown in Table 2.

As clear from the results indicated in Table 2, each of Samples Nos. 35 to 39 according to the present invention have high porosity and thermal conductivity, satisfactory crystallinity and moisture resistance, and a low dielectric constant.

EXAMPLE 6 (Sample No. 40)

In this example, a circuit board having the cross-sectional structure shown in FIG. 8 was prepared. In FIG. 8, a reference numeral 71 denotes an Si substrate; 72 an $SiO_2$ film; 73 an Al conductive film; 74 an AlN dielectric film; 75 pores; and 76 an Al conductive film.

An Si substrate 71, on which an $SiO_2$ film 72 had been formed, was prepared. A sputtering process targeting Al was performed in an Ar gas atmosphere under a sputtering pressure of 1 Pa, thereby forming a Al conductive film 73 on the $SiO_2$ film 72. In this process, the sputtering power was 2 kW and the substrate temperature was 200° C.

Then, a sputtering process targeting Al was performed in a gas atmosphere containing nitrogen, thereby forming an AlN dielectric film 74 having a thickness of 2 $\mu m$ on the Al conductive film 73. In this process, the sputtering power was 6 kW and the substrate temperature was 20° C. An Ar gas and a nitrogen gas were used as the gas atmosphere in a ratio of flow rates 5/1 and the sputtering pressure was maintained at 15 Pa. At this time, the Ar gas of the atmosphere was taken into the AlN dielectric film 74, resulting in formation of pores 75.

Thereafter, an Al conductive film 76 was formed by the sputtering under the same conditions as the process for forming the Al conductive film 73. The Al conductive film 76 was patterned into a size of 100 $\mu m \times 100$ $\mu m$, thus forming an upper electrode.

In Sample No. 40 thus obtained, the pores 75 were formed in the process control of the sputtering. Thus, Sample No. 40 is equivalent to Samples Nos. 1 to 18 obtained in Example 1. With respect to Sample No. 40, the dielectric constant, the porosity, the resistivity, the crystallinity of the dielectric film, the moisture resistance and the thermal conductivity were evaluated in the same manner as in Example 2 (Samples Nos. 20 to 24). The results of the evaluation are shown in Table 2.

As clear from the results indicated in Table 2, Sample No. 40 according to the present invention has a satisfactory moisture resistance; however, it has a lower porosity than in Examples 2 to 5 (Samples Nos. 20 to 39). Further, it has lower coefficient of thermal conductivity and crystallinity and higher dielectric constant as compared to Examples 2 to 5.

COMPARATIVE EXAMPLE

In this comparative example, a circuit board having the cross-sectional structure shown in FIG. 9 was prepared. In FIG. 9, a reference numeral 81 denotes an Si substrate; 82 an $SiO_2$ film; 83 an Al conductive film; 84 an $SiO_2$ dielectric film; 85 pores; and 86 an Al conductive film.

An Si substrate 81, on which an $SiO_2$ film 82 had been formed, was prepared. A sputtering process targeting Al was performed in an Ar gas atmosphere under a sputtering pressure of 1 Pa, thereby forming a Al conductive film 83 on the $SiO_2$ film 82. In this process, the sputtering power was 3 kW and the substrate temperature was 100° C.

Then, a sputtering process targeting Si was performed in a gas atmosphere containing oxygen, thereby forming an $SiO_2$ dielectric film 84 having a thickness of 5 $\mu m$ on the Al conductive film 83. In this process, the sputtering power was 6 kW and the substrate temperature was 20° C. An Ar gas and a oxygen gas were used as the gas atmosphere in a ratio of flow rates 5/1 and the sputtering pressure was maintained at 15 Pa. At this time, the Ar gas of the atmosphere was taken into the $SiO_2$ dielectric film 84, resulting in formation of random pores 85. Some of the pores 85 were opened through the side walls of the $SiO_2$ dielectric film 74.

Thereafter, an Al conductive film 86 was formed by the sputtering under the same conditions as the process for forming the Al conductive film 83. The Al conductive film 86 was patterned into a size of 100 $\mu m \times 100$ $\mu m$, thus forming an upper electrode.

With respect to Sample No. 41, the dielectric constant, the porosity, the resistivity, the crystallinity of the dielectric film, the moisture resistance and the thermal conductivity were evaluated in the same manner as in Example 2 (Samples Nos. 20 to 24). The results of the evaluation are shown in Table 2.

As clear from the results indicated in Table 2, since the $SiO_2$ dielectric film 84 of Sample No. 41 is made of a material different from those of the present invention, it has a lower thermal conductivity. Further, it has a lower resistivity and an inferior moisture resistance, since the pores 85 are not completely closed.

TABLE 2

| No. | A ($\mu m$ square) | B ($\mu m$) | C ($\mu m$) | Relative dielectric constant | Resistivity ($\Omega \cdot cm$) |
|---|---|---|---|---|---|
| 20 | 2 | 2 | 0.1 | 1.4 | $2 \times 10^{14}$ |

TABLE 2-continued

| No. | | | | | |
|---|---|---|---|---|---|
| 21 | 3 | 3 | 0.15 | 1.4 | $2 \times 10^{14}$ |
| 22 | 1 | 1.1 | 0.025 | 1.2 | $2 \times 10^{14}$ |
| 23 | 1 | 1 | 1 | 6.6 | $2 \times 10^{14}$ |
| 24 | 2 | 2 | 0.25 | 4.5 | $3 \times 10^{14}$ |
| 25 | 5 | 5 | 1.25 | 2.9 | $2 \times 10^{14}$ |
| 26 | 1 | 2 | 0.025 | 1.2 | $3 \times 10^{14}$ |
| 27 | 1 | 4 | 0.025 | 1.2 | $3 \times 10^{14}$ |
| 28 | 1 | 1 | 0.5 | 5.0 | $2 \times 10^{14}$ |
| 29 | 1 | 1 | 0.4 | 4.0 | $4 \times 10^{14}$ |
| 30 | 1 | 10 | 1 | 3.7 | $3 \times 10^{13}$ |
| 31 | 1 | 15 | 1 | 3.4 | $2 \times 10^{13}$ |
| 32 | 2 | 15 | 1 | 2.8 | $3 \times 10^{13}$ |
| 33 | 4 | 15 | 1 | 2.1 | $3 \times 10^{13}$ |
| 34 | 2 | 15 | 0.6 | 2.1 | $2 \times 10^{13}$ |
| 35 | 5 | 30 | 2 | 2.4 | $3 \times 10^{14}$ |
| 36 | 2 | 30 | 0.6 | 2.3 | $3 \times 10^{14}$ |
| 37 | 4 | 30 | 0.7 | 1.6 | $2 \times 10^{14}$ |
| 38 | 1 | 20 | 1 | 3.6 | $3 \times 10^{14}$ |
| 39 | 5 | 20 | 1 | 2.3 | $3 \times 10^{14}$ |
| 40 | | | | 7.0 | $3 \times 10^{14}$ |
| 41 | | | | 2.0 | $1 \times 10^{11}$ |

| No. | Thermal conductivity | Crystallinity | Porosity | Moisture resistance | D |
|---|---|---|---|---|---|
| 20 | 23 | 0.99 | 86 | Acceptable | 2.2 |
| 21 | 23 | 0.98 | 86 | " | 3.3 |
| 22 | 11 | 0.97 | 93 | " | 1.2 |
| 23 | 221 | 0.99 | 10 | " | 2.0 |
| 24 | 48 | 0.98 | 69 | " | 2.5 |
| 25 | 90 | 0.99 | 49 | " | 6.3 |
| 26 | 5 | 0.97 | 95 | " | 2.1 |
| 27 | 5 | 0.97 | 96 | " | 4.0 |
| 28 | 160 | 0.97 | 26 | " | 2.0 |
| 29 | 123 | 0.98 | 34 | " | 1.8 |
| 30 | 520 | | 36 | " | 12 |
| 31 | 470 | | 39 | " | 17 |
| 32 | 300 | | 56 | " | 17 |
| 33 | 190 | | 69 | " | 17 |
| 34 | 190 | | 70 | " | 16 |
| 35 | 68 | 1.0 | 60 | " | 34 |
| 36 | 44 | 1.0 | 73 | " | 31 |
| 37 | 30 | 1.0 | 81 | " | 31 |
| 38 | 116 | 1.0 | 42 | " | 22 |
| 39 | 44 | 1.0 | 74 | " | 22 |
| 40 | 0.6 | 0.3 | 15 | " | 2 |
| 41 | 1.0 | 0.6 | 50 | Rejected | 5 |

As has been described in detail, according to the present invention, there is provided a circuit board which satisfies the two requirements of a high heat radiating property and a high speed signal transmitting property and in which defects such as delamination do not easily occur. Therefore, the circuit board of the present invention can be applied to mount a highly-integrated semiconductor devices which is operated at high speed, and is significantly valuable for industry.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A circuit board comprising:
   a substrate;
   at least one dielectric film formed on the substrate and made of at least one material selected from the group consisting of AlN, BN, diamond, diamond-like carbon, BeO and SiC, said dielectric film having closed pores of a porosity of 5 to 95% by volume; and
   at least one wiring metal film formed on said dielectric film.

2. The circuit board according to claim 1, wherein said dielectric film is formed by a thin film process and the pores are formed by controlling conditions of the thin film process.

3. The circuit board according to claim 1, wherein the pores are formed by etching or perforating said dielectric film formed on said substrate.

4. The circuit board according to claim 3, wherein the pores are arranged in row directions and column directions at regular pitches in a plan view, and positions of the pores of one row are shifted by half of the pitch of pores of an adjacent row.

5. The circuit board according to claim 3 or 4, wherein the pores are formed only under said wiring metal film.

6. A method for forming a circuit board comprising the steps of:
   forming, on a substrate, a first dielectric film made of at least one material selected from the group consisting of AlN, BN, diamond, diamond-like carbon, BeO and SiC;
   forming minute pores having openings on a surface of the first dielectric film by selectively etching or perforating the first dielectric film;
   forming a second dielectric film of the same material as that of the first dielectric film, on the first dielectric film in which the minute pores are formed, so as to close the openings of the minute pores, thereby forming a dielectric film having a porosity of 5 to 95% by volume; and
   forming a wiring metal film on the dielectric film having the porosity of 5 to 95% by volume.

7. The method for forming a circuit board according to claim 6, wherein the minute pores have a diameter of at most 1 μm.

* * * * *